(12) United States Patent
Washburn et al.

(10) Patent No.: US 10,096,536 B1
(45) Date of Patent: Oct. 9, 2018

(54) GRAPHENE HEAT DISSIPATING STRUCTURE

(71) Applicants: National Technology & Engineering Solutions of Sandia, LLC, Albuquerque, NM (US); Qorvo US, Inc., Greensboro, NC (US)

(72) Inventors: Cody M. Washburn, Albuquerque, NM (US); Timothy N. Lambert, Albuquerque, NM (US); David R. Wheeler, Albuquerque, NM (US); Christopher T. Rodenbeck, Alexandria, VA (US); Tarak A. Railkar, Plano, TX (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/618,000

(22) Filed: Jun. 8, 2017

Related U.S. Application Data

(62) Division of application No. 14/662,091, filed on Mar. 18, 2015, now Pat. No. 9,721,867.

(51) Int. Cl.
*B82Y 40/00* (2011.01)
*H01L 21/02* (2006.01)
*H01L 23/373* (2006.01)

(52) U.S. Cl.
CPC .... *H01L 23/3737* (2013.01); *H01L 21/02115* (2013.01); *H01L 21/02282* (2013.01); *H01L 21/02318* (2013.01)

(58) Field of Classification Search
None
See application file for complete search history.

(56) References Cited

U.S. PATENT DOCUMENTS

| | | | | |
|---|---|---|---|---|
| 8,889,475 | B1 * | 11/2014 | Farmer | H01L 29/66477 |
| | | | | 257/288 |
| 9,064,698 | B1 * | 6/2015 | Khakifirooz | H01L 21/02444 |
| 2011/0143101 | A1 * | 6/2011 | Sandhu | B82Y 30/00 |
| | | | | 428/195.1 |

OTHER PUBLICATIONS

ZChang et al., Bulk functionalization of graphene using diazonium compounds and amide reaction, May 27, 2013, Applied Surface Science 280 (2013) 914-919.*

* cited by examiner

*Primary Examiner* — Charles D Garber
*Assistant Examiner* — Xiaoming Liu
(74) *Attorney, Agent, or Firm* — Medley, Behrens & Lewis, LLC

(57) ABSTRACT

Various technologies presented herein relate to forming one or more heat dissipating structures (e.g., heat spreaders and/or heat sinks) on a substrate, wherein the substrate forms part of an electronic component. The heat dissipating structures are formed from graphene, with advantage being taken of the high thermal conductivity of graphene. The graphene (e.g., in flake form) is attached to a diazonium molecule, and further, the diazonium molecule is utilized to attach the graphene to material forming the substrate. A surface of the substrate is treated to comprise oxide-containing regions and also oxide-free regions having underlying silicon exposed. The diazonium molecule attaches to the oxide-free regions, wherein the diazonium molecule bonds (e.g., covalently) to the exposed silicon. Attachment of the diazonium plus graphene molecule is optionally repeated to enable formation of a heat dissipating structure of a required height.

8 Claims, 6 Drawing Sheets

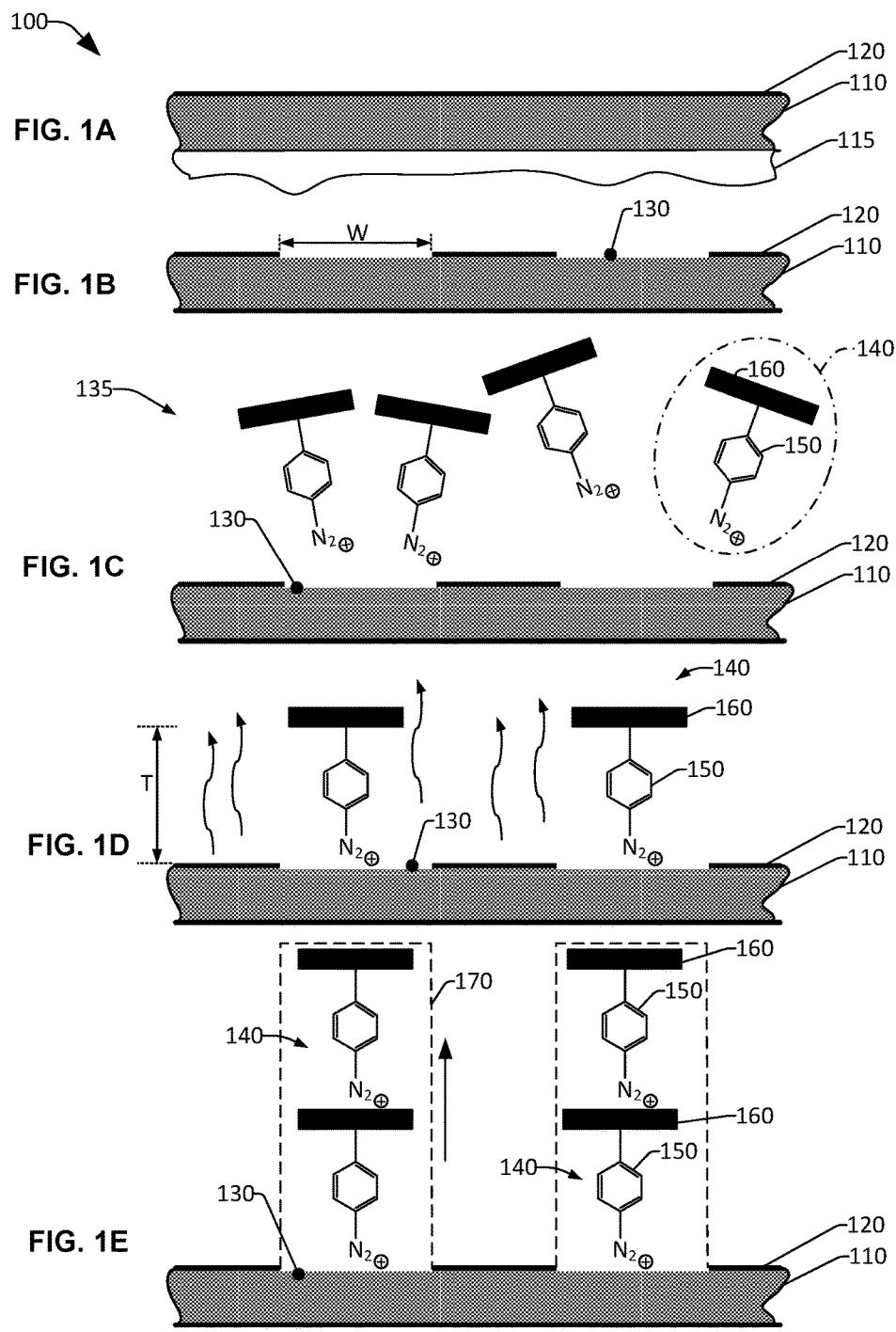

GRAPHENE HEAT DISSIPATING STRUCTURE

CROSS-REFERENCE TO RELATED APPLICATIONS

This application is a divisional application of, and discloses subject matter that is related to subject matters disclosed in, co-pending parent application U.S. Ser. No. 14/662,091, filed Mar. 18, 2015 and entitled "GRAPHENE HEAT DISSIPATING STRUCTURE". The present application claims the priority of its parent application, which is incorporated herein by reference in its entirety for any purpose.

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

During operation, electronic components, such as die level packaged integrated circuits, can generate a considerable amount of heat. Suppliers of these packages typically do not design for optimal dissipation of the energy generated from high performance RF transceivers. Heat generation can be of particular concern with regard to a requirement to continually reduce component size while preventing the generated heat from deleteriously affecting operation of the component.

Fins and other heat dissipating surfaces and/or structures can be utilized to extract heat from a component but may suffer from outside the package constraints and may not be scalable to fit within the die level hardware. While such structures can be separate components which are bonded to the component surface (e.g., by an adhesive), efficiency of heat removal can be impaired as the dissipating structure is not directly attached to the component at an atomic level (e.g., by covalent bonding). Further, attaching a structure formed from a material having a desirable thermal conductivity may not be readily achievable with conventional technologies.

SUMMARY

The following is a brief summary of subject matter that is described in greater detail herein. This summary is not intended to be limiting as to the scope of the claims.

Various, exemplary, non-limiting embodiments presented herein relate to forming one or more heat dissipating structures (e.g., heat spreaders and/or heat sinks) on a substrate, wherein the substrate can form part of an electronic component.

The heat spreaders(s) and/or heat sink(s) can be formed from graphene, with advantage being taken of the high thermal conductivity of graphene material. The substrate can have an oxide layer formed on its surface. Subsequently, one or more regions of the oxide layer can be removed to enable exposure of underlying material. In an embodiment, the substrate can be formed from silicon carbide, the oxide layer can be silicon dioxide, and removal of the oxide exposes underlying silicon.

The graphene (e.g., in flake form) can be attached to a diazonium molecule, and further, the diazonium molecule can be utilized to attach the graphene to material forming the substrate. In an embodiment, the diazonium molecule can form a bond (e.g., a covalent bond) with silicon in the regions of exposed substrate material. Further, the diazonium molecule does not bond to the oxide containing regions, hence, regions comprising diazonium and graphene form over the non-oxide regions which are interspersed between the oxide containing regions.

Molecules comprising diazonium and graphene can be applied to the substrate in a solution, wherein a solvent in the solution can be anhydrous acetonitrile.

A surface of the substrate can be treated to comprise an arrangement of patterned oxide containing regions and also oxide-free regions having underlying silicon exposed. The diazonium molecule(s) can attach to the oxide-free regions, wherein the diazonium molecule(s) bonds (e.g., covalently) to the exposed silicon. Attachment of the diazonium plus graphene molecules can be repeated to enable formation of a heat sink(s) of a required height.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

FIGS. 1A-1E illustrate various stages involved in forming a graphene-containing layer, in accordance with one or more embodiments.

DETAILED DESCRIPTION

Figure 2A:
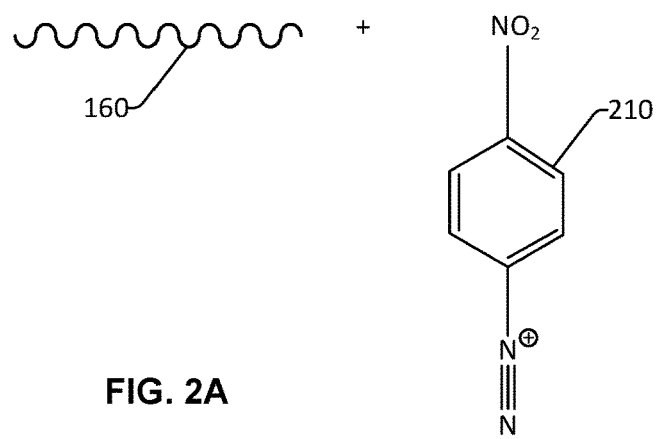
FIGS. 2A-C illustrate chemical reactions during formation of a molecule comprising diazonium and graphene, and attachment of the molecule to a substrate.

Various technologies are presented herein pertain to forming a graphene heat spreader and/or heat sink on a substrate, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

Various embodiments presented herein relate to forming one or more heat dissipating structures (e.g., heat spreaders and/or heat sinks) on a substrate, wherein the substrate can form part of an electronic component such as a power device, an integrated circuit, a semiconductor-containing device, etc. The heat dissipating structure(s) can be formed from graphene, with advantage being taken of the high thermal conductivity (e.g., greater than about 2000 W mK$^{-1}$, about 2000-4000 Wm$^{-1}$K$^{-1}$ at room temperature). Further, advantage can be made of a graphene heat dissipating structure being atomically close to a surface of a substrate to enable minimization of an air gap at the substrate surface. The graphene (e.g., in flake form) can be attached to a diazonium molecule, and further, the diazonium molecule can be utilized to attach the graphene to material forming the substrate.

FIGS. 1A-1E illustrate various stages in constructing a graphene heat dissipating structure on a substrate. As shown in FIG. 1A, a substrate 110 is formed, wherein the substrate can have an upper surface which has an oxide layer 120. In an embodiment, the substrate 110 can be formed from silicon carbide (SiC) (or SiC polytypes such as 4H—SiC and 6H—SiC), and the oxide layer can be a silicon-containing oxide such as silicon dioxide ($SiO_2$). The oxide layer 120 can be formed by any suitable oxidation process, and can be of any suitable thickness. In an embodiment, the oxide layer 120 can have a naturally grown thickness of about 10-20 nm as a result of interaction of material comprising the substrate 110 with ambient conditions (e.g., ambient oxygen). In another embodiment, an oxide layer 120 can be a protective passivation layer intentionally formed on the substrate 110, wherein such a passivation layer can be about 1-3 microns thick. It is to be appreciated that the various dimensions presented herein are example, non-limiting, values, and the dimensions can have any magnitude (e.g., oxide layer thickness can be based upon one or more specifics of a process of formation and/or application).

In an embodiment, the substrate 110 may also be a gallium arsenide (GaAs) or other material comprising a precious metal(s) which can be utilized on a back side of a die to form a ground plane(s).

It is to be appreciated that while the substrate 110 is presented as a single layer of $SiO_2$, the substrate 110 can act as a cover layer formed over an underlying layer 115, wherein the layer 115 can be formed from any material utilized in fabrication of a component for which the various embodiments presented herein are applicable. For example, the layer 115 can be formed from gallium nitride (GaN), silicon nitride ($Si_3N_4$), etc. Further, while the layer 115 is only illustrated in FIG. 1A, it is to be appreciated that the layer 115 can also be present in any structure presented herein.

Turning to FIG. 1B, portions of the oxide layer 120 can be removed to enable regions of oxide 120 to remain, while at regions 130 where the oxide has been removed, the underlying silicon substrate is exposed. In an embodiment, the silicon oxide regions can be removed by application of any suitable etchant, where such an etchant can be a fluoride containing-etchant such as hydrofluoric acid (HF), a mixture of HF and nitric acid ($HNO_3$), etc., wherein the etchant can be gas and/or liquid phase. Various methods can be utilized to remove the oxide, e.g., wet etch, dry etch, etc. A chemical etch of short duration (e.g., momentary) can remove one or more regions of the oxide layer 120 to expose the underlying silicon in the substrate 110.

As a function of oxide removal with HF, a portion of the silicon (Si) in the region of exposed SiC is terminated with a hydrogen atom(s), e.g., the exposed Si is hydrogen-passivated. Accordingly, the oxide regions 120 are passive to reaction with a diazonium molecule (e.g., an arlydiazonium salt (I-VI)), while the hydrogen terminated Si regions 130 are receptive to bonding with a diazonium molecule, as further described below. The oxide-free region 130 can have a width w of any required magnitude, for example, w can have a value in a range of about $10\times10^{-9}$ meters (10's of nanometers) to about $10\times10^{-6}$ meters (10's of microns). In an embodiment, masking and/or patterning can utilize soft lithography technology, wherein such technology can be polydimethylsiloxane stamping (PDMS stamping). For example, capillary action of an etchant in channels formed between respective regions of a PDMS stamp can effect wicking of the oxide to form the oxide-free region(s) 130. Control of the etching process can be based at least in part upon a viscosity of the etchant.

As shown in FIG. 1C, the oxide-free regions 130 are covered with a solution 135 comprising a plurality of molecules 140, wherein the molecules 140 can each comprise diazonium 150 with graphene flakes 160 attached thereto, wherein each graphene flake 160 in each molecule 140 can be attached to a diazonium molecule 150 by covalent bonding. And further, a molecule 140 can attach to the silicon at the oxide-free regions 130, wherein the terminating hydrogen atom(s) formed during the material removal operation described in FIG. 1B are replaced by the diazonium molecule 150, the displaced hydrogen atom(s) can form water ($H_2O$) which can be removed, e.g., by evaporation, physically removed, etc. The solution 135 can comprise the molecules 140 dispersed in a solvent such as anhydrous acetonitrile ($CH_3CN$). Further, the solution 135 and the reaction can be at a temperature range of about 0° C. to room temperature.

In an embodiment, the solution 135 can be an ink, where, in a further embodiment, the ink can comprise less than 10% by weight of diazonium 150 (e.g., acting as an organic binder). The graphene flakes 160 can be two-dimensional (2-D) exfoliated graphene. In a further embodiment, the molecules 140 can be blended into an epoxy-based resin system (e.g., a two part epoxy) which can have low outgassing characteristics. In another embodiment, the molecules 140 can be incorporated into ultraviolet (UV) curable epoxy. The epoxy-based resin system and/or the UV curable epoxy can further include an amine and/or a silane based monomer material. The solution 135 can further include an ionic liquid.

Per FIG. 1D, respective molecules 140 can be attached to the oxide-free regions 130, with the $H_2O$ by-product and various volatiles in the solution 135 being driven off by heating the substrate 110. In an embodiment, a temperature in the range of about 80-140° C. can be utilized during the drying operation, however, any suitable temperature can be utilized based upon a required rate and/or time of drying (e.g., boiling point of solvents and/or surfactants in solution 135) while taking into consideration prevention of damage to the newly formed layer(s) of molecules 140.

To further increase a thickness of the layer of molecules 140 being deposited and/or formed on the substrate 110

(e.g., at the oxide-free regions 130) the solution 135 can be reapplied. During reapplication of the solution 135, the diazonium molecules 150 can attach to a graphene flake 160 that is already attached to the substrate 110 via the diazonium molecule 150, to which the graphene flake 160 is attached. Reapplication and removal (e.g., driving off, drying) of the solution 135 can be repeated as many times as necessary to form a layer of molecules 140 of a desired thickness, e.g., a solution 135 comprising molecules 140 can be applied and removed n-times, where n is an integer greater than 1. The layer of molecules 140 can be built to form a heat dissipating structure 170 of any desired thickness, where such thickness of the layer of molecules 140 can be designed for optimization at about $1 \times 10^{-6}$ meters (about 1 micron). In an example, maximum height (thickness) of a heat dissipating structure (e.g., a heat sink) 170 can be about $50 \times 10^{-6}$ meters (about 50 microns), or as limited by a mechanically stability of the heat dissipating structure 170 so formed.

Figure 2B:
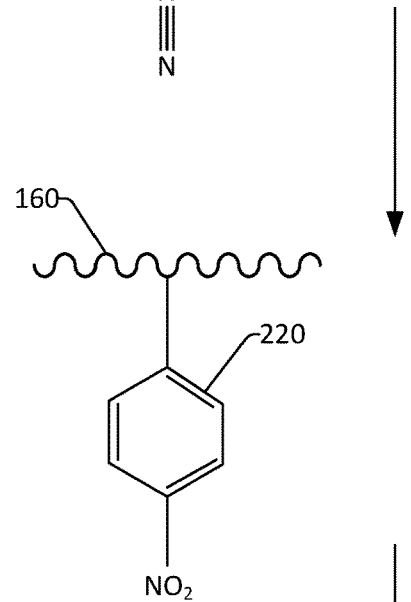
Figure 2C:
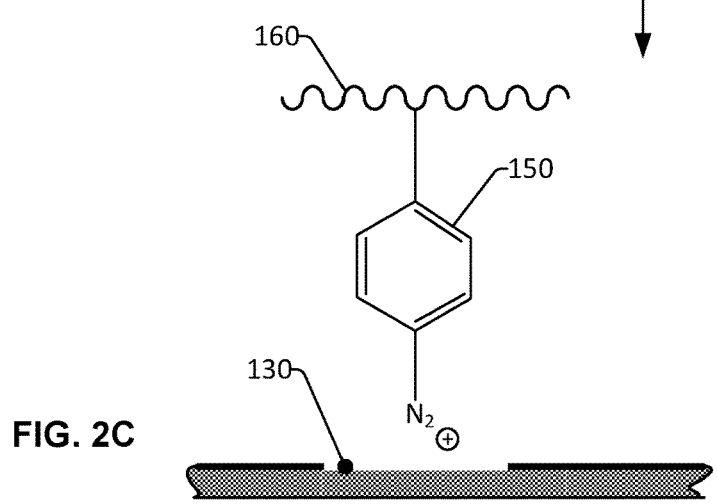

FIGS. 2A-2C illustrate stages in the formation of a molecule 140 comprising a diazonium molecule 150 and a graphene flake 160. An initial condition can comprise of a 4-nitrobenzenediazonium molecule 210 and a graphene flake 160, as shown in FIG. 2A. The graphene flake 160 can be treated with para-nitrophenyldiazonium tetrafluoroborate (the anion of which is not illustrated), wherein a nitrogen atom is lost from the 4-nitrobenzenediazonium molecule 210, as is known in the chemical arts. The reduction and subsequent diazotination generates a new diazonium molecule 220 available for subsequent attachment of the graphene flake 160, as shown in FIG. 2B.

Per FIG. 2C, the diazonium molecule 150 can react with the silicon exposed in regions 130 of FIG. 1.

While FIGS. 2A-C illustrate the molecule 140 being formed and subsequently attached to a substrate (e.g., substrate 110), other methods of formation can be utilized. For example, self-condensation of one or more molecules 140 may occur, which can be addressed by initially attaching the nitrodiazonium molecule to the substrate (e.g., the silicon), reducing and diazotizing the molecule, to which a graphene flake can be subsequently attached. The example approach can be repeated to build a heat dissipating structure, wherein nitrodiazonium molecules can be subsequently attached to the graphene layers of the heat dissipating as it is being formed.

Figure 3A:
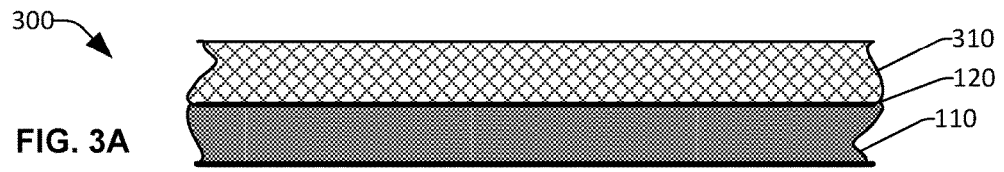
FIGS. 3A-E illustrate various stages involved in forming a graphene-containing layer, in accordance with one or more embodiments.

FIGS. 3A-3E illustrate various stages in constructing a graphene heat dissipating structure on a substrate, where, in comparison with the technique presented in FIGS. 1A-1E, rather than forming the diazonium plus graphene layer on oxide-free regions 130 separated by oxide regions 120, the diazonium plus graphene layer(s) is bounded by regions of inorganic material, where such inorganic material can be $Si_3N_4$, $SiO_2$, etc. As shown in FIG. 3A, a substrate 110 is formed, wherein the substrate can have an upper surface which has an oxide layer 120 formed thereon. In an embodiment, the substrate 110 can be formed from SiC, and the oxide layer 120 can be a silicon-containing oxide such as $SiO_2$. Formed over the oxide layer 120 is a layer 310, wherein the layer 310 can comprise of silicon nitride (SiN), silicon oxide ($Si_2O_3$), etc.

Figure 3B:
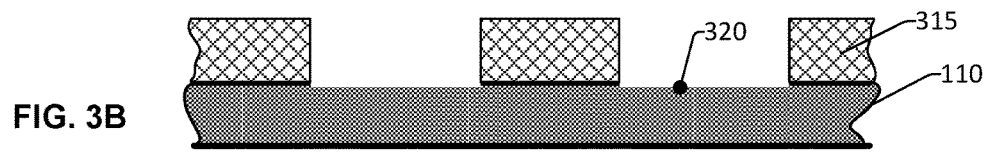

Per FIG. 3B, the layer 310 can be patterned to form the raised portions 315. As part of the patterning process, respective exposed portions of the oxide layer 120 can also be removed resulting in exposed regions 320 of silicon. Patterning to form the portions 315 can be by any suitable technique, such as photolithography, photoresist, etc. (e.g., masking and material removal). As previously mentioned, the exposed oxide regions of layer 120 can be removed by application of any suitable etchant, such as HF, a mixture of HF and $HNO_3$, etc. As a function of removing with HF (and $HNO_3$), a portion of the silicon in the exposed SiC at regions 320 is terminated with a hydrogen atom(s).

Figure 3C:
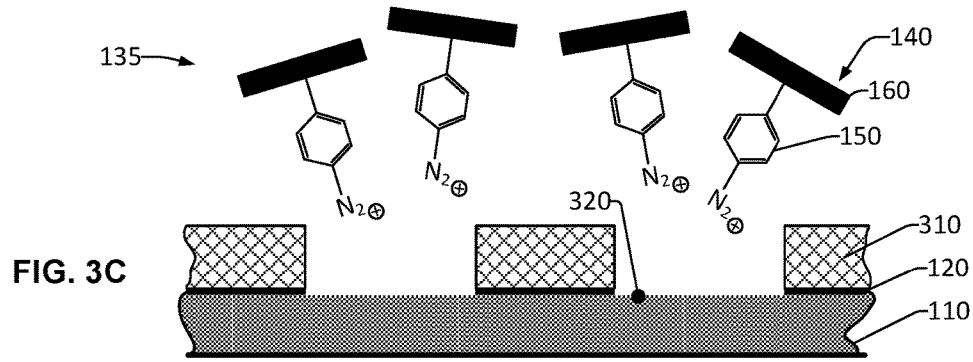

As shown in FIG. 3C, the oxide-free regions 320 are covered with a solution 135 comprising molecules 140 of diazonium 150 with graphene flakes 160 attached thereto. As previously mentioned, a molecule 140 can attach to the Si at the oxide-free regions 130, wherein the terminating hydrogen atom(s) are replaced by the diazonium molecule 150, the displaced hydrogen atom(s) can form water ($H_2O$) which can be removed.

Figure 3D:
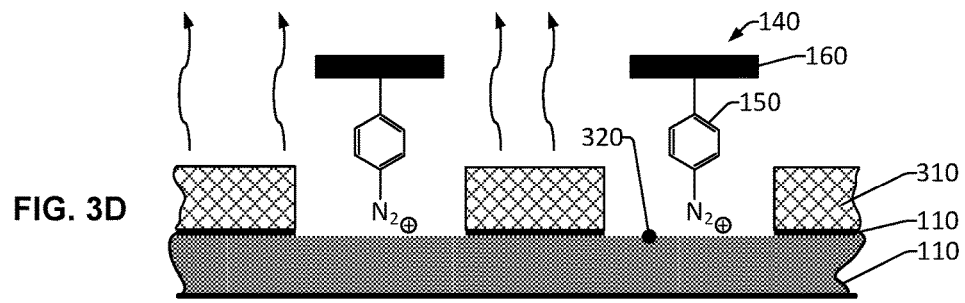

Per FIG. 3D, respective molecules 140 can be attached to the oxide-free regions 320, with the $H_2O$ by-product and various volatiles in the solution 135 can be driven off by heating the substrate 110, as previously described.

Figure 3E:
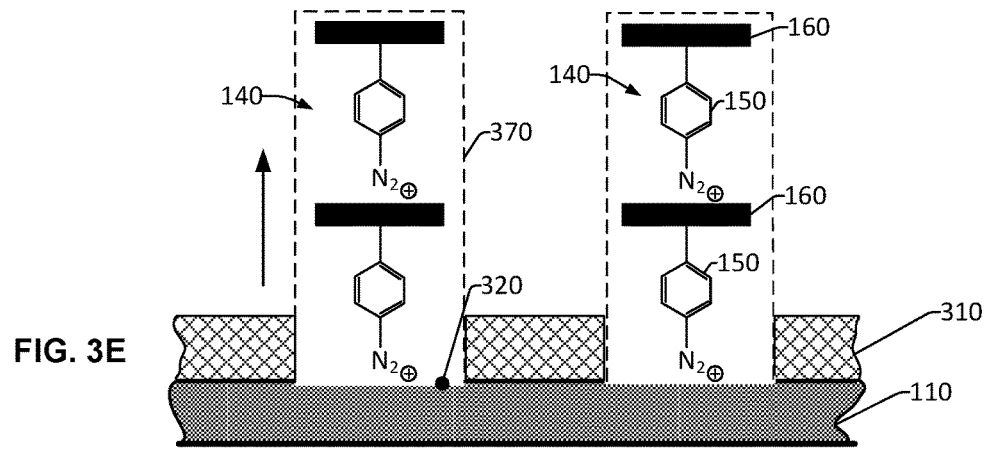

To further increase a volume of molecules 140 being deposited and/or formed on the substrate 110 (e.g., at the oxide-free regions 320) the solution 135 can be reapplied, per FIG. 3E. During reapplication of the solution 135, the diazonium molecules 150 can be attached to a graphene flake 160 that is already attached to the substrate 320 (e.g., via the diazonium molecule 150 to which the graphene flake 160 is attached). Reapplication and removal (e.g., driving off, drying) of the solution 135 can be repeated as many times as necessary to form a layer of molecules 140 of a desired thickness, e.g., solution 135 can be applied and removed n-times, where n is an integer greater than 1. The layer of molecules 140 can be built to form a heat dissipating structure 370, where the heat dissipating structure 370 can have similar structure and function as the heat dissipating structure 170, as previously described.

Figure 4A:
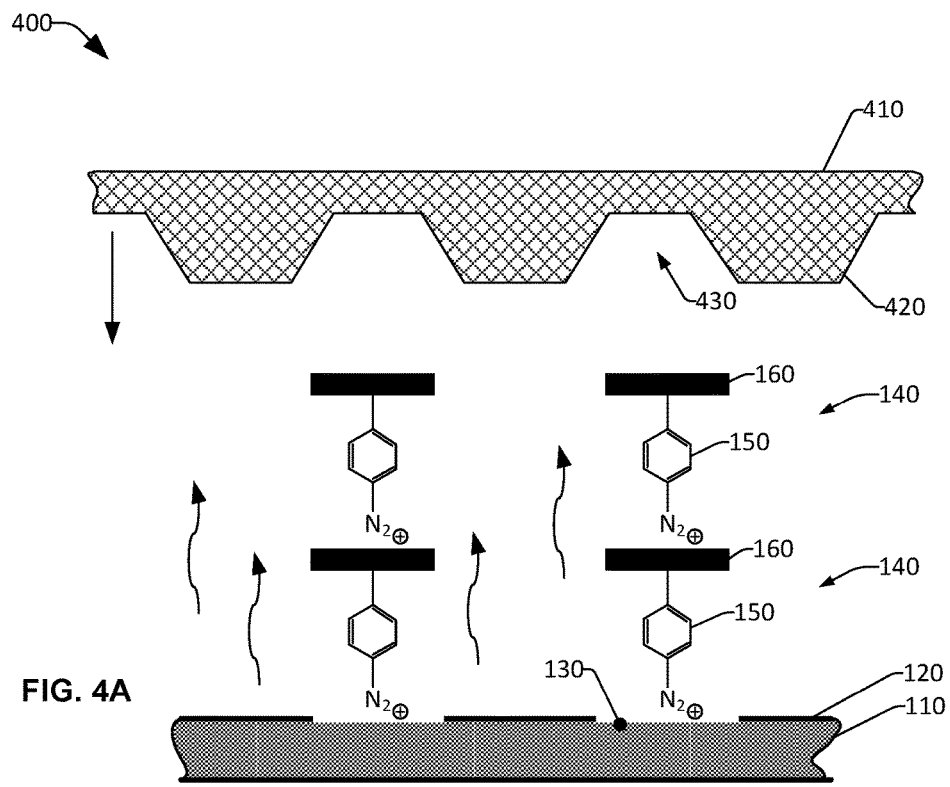
FIGS. 4A-B illustrate various stages involved in forming a graphene-containing layer, in accordance with one or more embodiments.
Figure 4B:
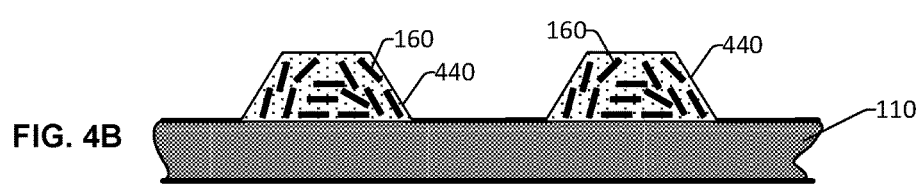

Turning to FIGS. 4A and 4B, a process for controlling a shape of a formed layer and/or also to effect an alignment of graphene flakes is presented. In an embodiment, as the molecules 140 are being deposited upon the substrate 120, for example, in conjunction with the processing presented in FIGS. 1A-1E, before the layer(s) comprising the molecules 140 is fully dried (e.g., is in a semi-solution phase), a tool 410 having a particular profile 420 can be brought into contact with the layer of molecules 140 as the layer is still in a partially wet state. The profile 420 of the tool 410 can cause the molecules 140 to be constrained to the "open" regions 430 formed by the profile 420. As shown in FIG. 4B, the respective layered regions 440 can be shaped by the tool 410 to have a stepped or finned profile. In an embodiment, the open regions 430 and the profile 420 can be configured such that the graphene flakes 160 of molecules 140 are forcibly aligned to have a non-horizontal alignment, e.g., the graphene flakes 160 can have an alignment from about 0° (e.g., at or near horizontal) to about 90° (e.g., vertically aligned).

Figure 5:
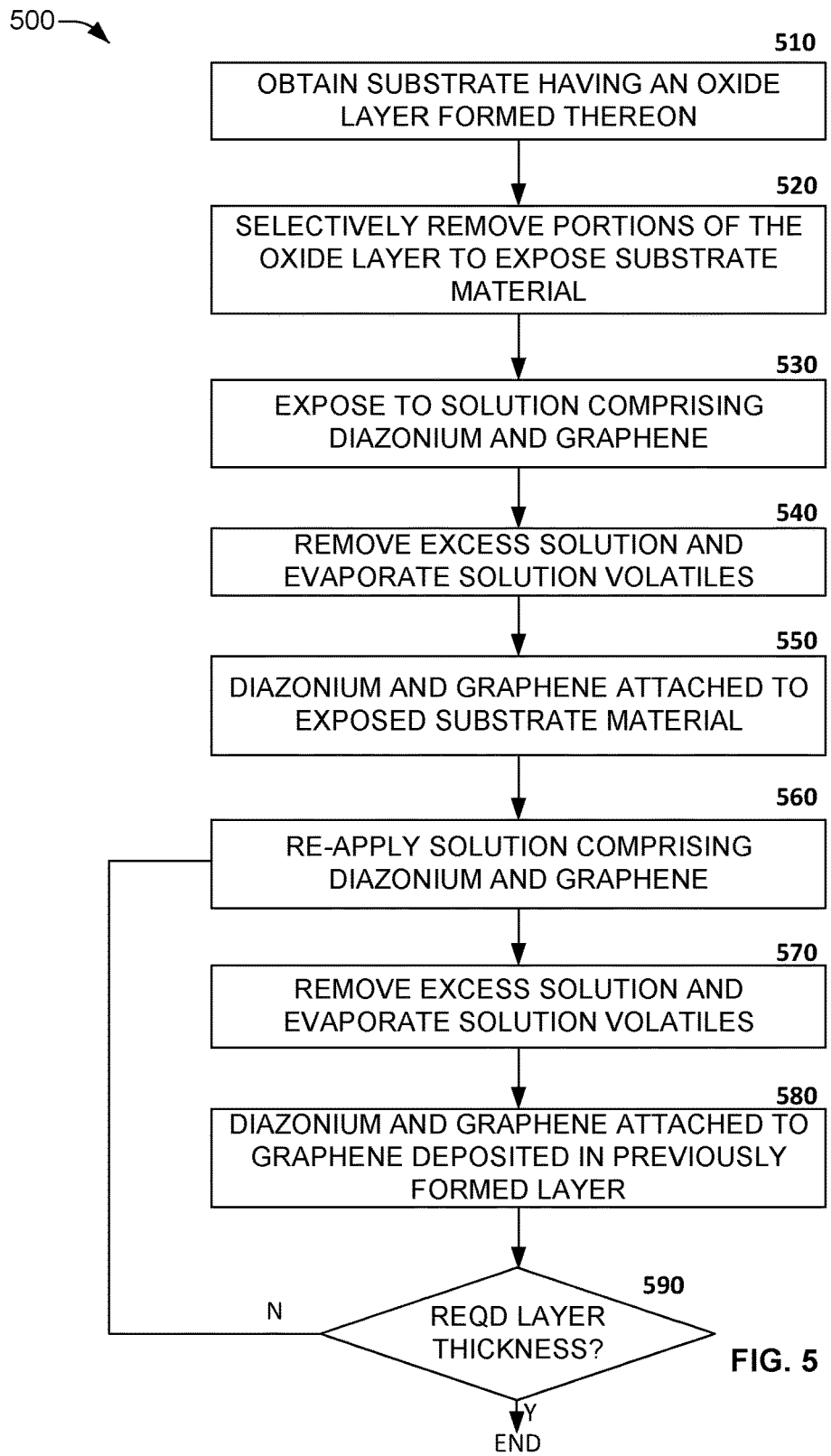
FIG. 5 is a flow diagram illustrating a method for forming a layer comprising graphene.
Figure 6:
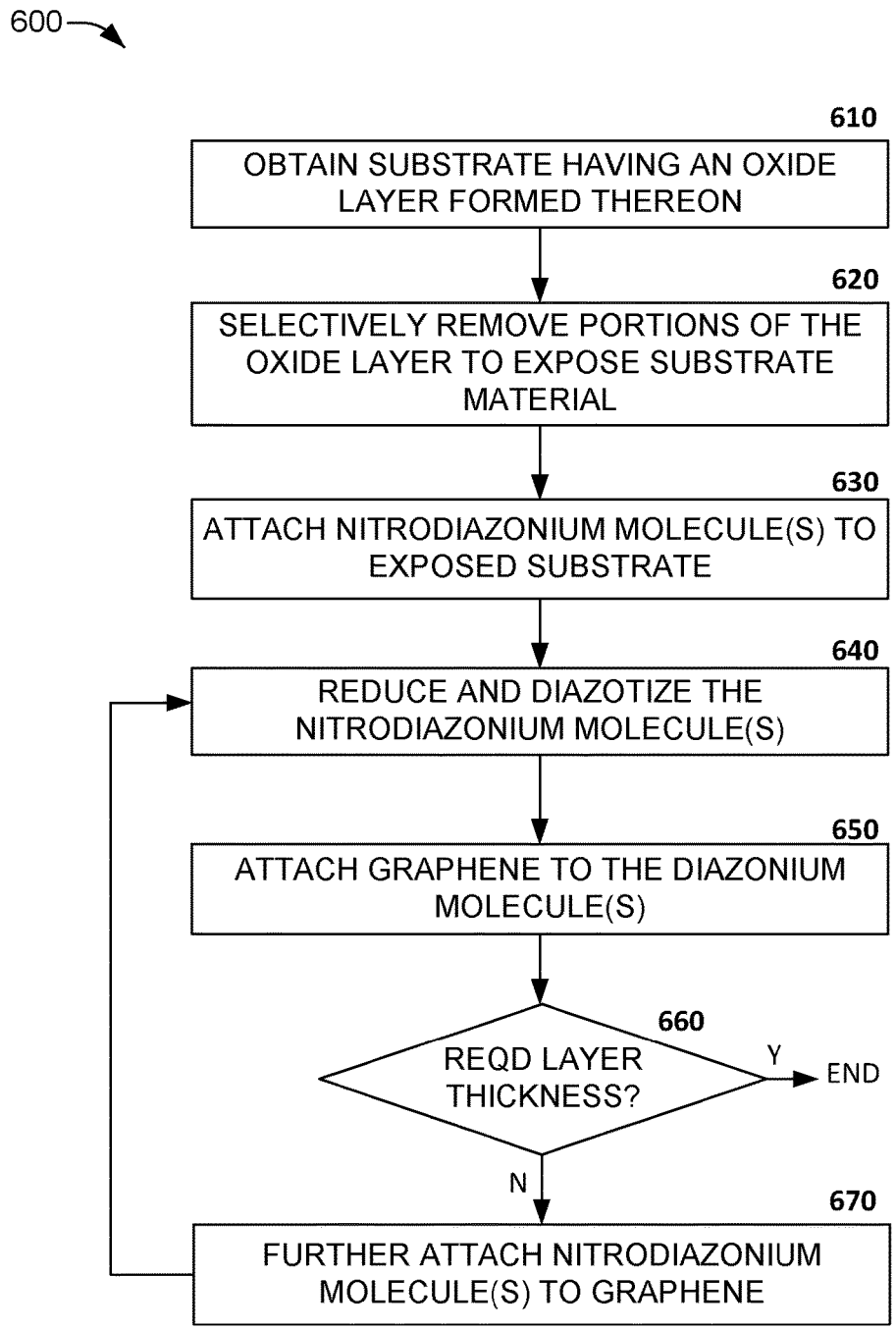
FIG. 6 is a flow diagram illustrating a method for forming a layer comprising graphene.

FIGS. 5 and 6 illustrate exemplary methodologies relating to formation of a layer comprising graphene. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement the methodologies described herein.

FIG. 5 illustrates an exemplary methodology relating to formation of a layer comprising graphene. At 510, a substrate having an oxide surface layer formed thereon is obtained. The substrate can be formed from SiC, and the oxide layer can be $SiO_2$.

At 520, one or more regions of the oxide surface layer can be removed, wherein, removal of the one or more regions of the oxide surface layer exposes Si in the underlying SiC substrate. The oxide surface layer can be removed with a fluorine comprising compound (e.g., HF acid).

At 530, the exposed Si in the SiC substrate can be exposed to a solution comprising molecules of diazonium having graphene molecules attached thereto.

At 540, any excess solution can be removed (e.g., wiped off, evaporated, etc.).

At 550, a first plurality of diazonium molecules remain attached to the exposed Si, wherein a first plurality of graphene molecules also remain on the surface of the SiC substrate owing to the graphene molecules being attached to the first plurality of diazonium molecules which are respectively attached to the Si in the SiC substrate.

At 560, the solution comprising the molecules of diazonium having graphene molecules attached thereto can be reapplied to the SiC substrate.

At 570, any excess solution can be removed.

At 580, a second plurality of diazonium molecules and graphene molecules remain attached to the substrate, wherein the second plurality of diazonium molecules are attached to the first plurality of graphene molecules remaining on the surface of the substrate as formed at 550. The second plurality of graphene molecules are attached to the second plurality of diazonium molecules.

At 590, a determination can be made regarding whether the layer being formed with the diazonium and graphene molecules has a required thickness. In event of a determination that the required thickness had not yet been achieved, the flow can return to 560 for further reapplication of the solution comprising diazonium and graphene molecules. The application and removal of the solution can be performed as many times as necessary to achieve the required layer thickness. With a determination that the layer has a required thickness, the various acts presented in FIG. 5 can be curtailed and the formed heat dissipating structure can be subsequently utilized to remove heat from an electronic component.

FIG. 6 illustrates an exemplary methodology relating to formation of a layer comprising graphene. At 610, a substrate having an oxide surface layer formed thereon is obtained. The substrate can be formed from SiC, and the oxide layer can be $SiO_2$.

At 620, one or more regions of the oxide surface layer can be removed, wherein removal of the one or more regions of the oxide surface layer exposes Si in the underlying SiC substrate. The oxide surface layer can be removed with a fluorine comprising compound (e.g., HF acid).

At 630, the exposed Si in the SiC substrate can be exposed to a solution comprising molecules of nitrodiazonium. The nitrodiazonium molecules can attach to the exposed Si in the underlying SiC substrate.

At 640, the nitrodiazonium molecules can undergo reduction and diazotization.

At 650, the diazonium molecules can be exposed to graphene flakes, wherein a graphene flake can attach to each diazonium molecule.

At 660, a determination can be made regarding whether the layer being formed with the diazonium molecules and graphene flakes has a required thickness. In event of a determination that the required thickness has not yet been achieved, the flow can advance to 670 wherein further nitrodiazonium molecules can be attached to the graphene flakes of the heat dissipating structure as it is being formed. The flow can return to 640 wherein the nitrodiazonium molecules can undergo reduction and diazotization, subsequent attachment of a graphene flake, etc.

With a determination at 660 that the layer has a required thickness, the various acts presented in FIG. 6 can be curtailed and the formed heat dissipating structure can be subsequently utilized to remove heat from an electronic component.

The various embodiments presented herein are applicable to any electronic components, where such electronic components can be amplifier chip sets for radio frequency (RF) applications (e.g., high power applications), complementary metal-oxide-semiconductors (CMOS), e.g., radiation hardened CMOS, silicon-based devices such as silicon-germanium (SiGe) devices, macro-scale lithium batteries, transformers and capacitor banks (e.g., high power) for various applications such as an industrial environment.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A method comprising:
   removing a first material from a first portion of a surface of a substrate to expose an underlying second material;
   applying a solution to the exposed second material, wherein the solution comprising a plurality of diazonium molecules and graphene flakes, a first diazonium molecule in the plurality of diazonium molecules has a first graphene flake attached to a first end of the diazonium molecule, and a second end of the diazonium molecule attaches to the exposed second material;
   heating the substrate to evaporate a solvent in the solution, wherein the diazonium molecule and attached graphene remain bonded to the second material;
   reapplying the solution comprising the plurality of diazonium molecules and graphene flakes; and
   reheating the substrate to cause evaporation of the solvent in the reapplied solution, wherein a second diazonium molecule with an attached second graphene flake bonds to the first graphene flake attached to the first diazonium molecule.

2. The method of claim 1, wherein the second material is silicon carbide.

3. The method of claim 2, wherein the first material is an oxide formed by oxidation of the silicon carbide.

4. The method of claim 1, wherein removal of the silicon oxide is with hydrofluoric acid.

5. A method, comprising:
   masking a plurality of regions on a surface of a silicon carbide substrate, wherein the silicon carbide surface comprises an oxide layer;

removing the oxide layer from unmasked regions of the oxide layer on silicon carbide surface to expose the underlaying silicon carbide;

applying a solution to the exposed silicon carbide, wherein the solution comprising molecules formed from diazonium and graphene;

heating the substrate causing solvent in the solution to evaporate, wherein a first plurality of the diazonium and graphene molecules in the solution remain bonded to the exposed silicon carbide causing a layer of diazonium and graphene molecules to form on the exposed silicon carbide; and reapplying the solution, wherein a second plurality of the diazonium and graphene molecules in the solution bond with the first plurality of the diazonium and graphene molecules bonded to the exposed silicon carbide causing the layer of diazonium and graphene molecules to increase in thickness.

6. The method of claim 5, wherein the layer of diazonium and graphene molecules formed on the exposed silicon carbide has a thickness in a range of about $10 \times 10^{-9}$ meters to about $50 \times 10^{-6}$ meters.

7. The method of claim 5, wherein the layer of diazonium and graphene molecules form a heat dissipating structure on the silicon carbide substrate.

8. The method of claim 5, wherein the oxide layer is removed with an etchant comprising fluorine.

* * * * *